(12) United States Patent
Sung et al.

(10) Patent No.: US 7,953,285 B2
(45) Date of Patent: May 31, 2011

(54) METHOD AND CIRCUIT OF HIGH PERFORMANCE VARIABLE LENGTH CODING AND DECODING FOR IMAGE COMPRESSION

(75) Inventors: Chih-Ta Star Sung, Glonn (DE); Yin-Chun Blue Lan, Wurih Township, Taichung County (TW); Shi-Ho Tien, Hsinchu (TW)

(73) Assignee: Taiwan Imagingtek Corporation, Jhudong (TW)

( * ) Notice: Subject to any disclaimer, the term of this patent is extended or adjusted under 35 U.S.C. 154(b) by 1012 days.

(21) Appl. No.: 11/593,198

(22) Filed: Nov. 3, 2006

(65) Prior Publication Data

US 2008/0107349 A1    May 8, 2008

(51) Int. Cl.
*G06K 9/36* (2006.01)
*G06K 9/46* (2006.01)

(52) U.S. Cl. ........................................................ 382/238

(58) Field of Classification Search ........................ None
See application file for complete search history.

(56) References Cited

U.S. PATENT DOCUMENTS

| | | | | |
|---|---|---|---|---|
| 5,317,397 A | * | 5/1994 | Odaka et al. | 375/240.15 |
| 5,428,396 A | * | 6/1995 | Yagasaki et al. | 375/240.16 |
| 5,467,136 A | * | 11/1995 | Odaka et al. | 375/240.15 |
| 6,016,162 A | * | 1/2000 | Odaka et al. | 375/240.04 |
| RE37,222 E | * | 6/2001 | Yonemitsu et al. | 375/240.16 |
| 6,501,563 B1 | * | 12/2002 | Sato et al. | 358/1.9 |
| 6,950,557 B2 | * | 9/2005 | Kimura | 382/239 |
| 7,424,163 B1 | * | 9/2008 | Ellis et al. | 382/244 |
| 2005/0063466 A1 | * | 3/2005 | Etoh et al. | 375/240.16 |

* cited by examiner

*Primary Examiner* — Yuzhen Ge

(57) ABSTRACT

The differential value of the adjacent pixels is calculated firstly and is coded by a VLC coding. The VLC coding includes codes representing the Quotient and Remainder with a marker bit inserted in between. The divider is predicted with no code in the coded data stream. If three pixel components are presented in the same clock time, three VLC encoders and three VLD decoders are applied to encode and decode one pixel at a time. During encoding, both Remainder and Quotient of the same pixel component are encoded in parallel followed. During decoding, both Remainder and Quotient of the same pixel component are decoded in parallel and the results of the first pixel component are used a reference to decode the second pixel component which adopts the same decoding procedure and the decoded results of the second pixel component is used as reference to decode the third pixel component.

18 Claims, 8 Drawing Sheets

31              32

| Diff. of adjacent Pixels | Code with K=3 (Divider=8) |
|---|---|
| 0 | 1000 |
| 1 | 1001 |
| 2 | 1010 |
| 3 | 1011 |
| 4 | 1100 |
| 5 | 1101 |
| 6 | 1110 |
| 7 | 1111 |
| 8 | 01000 |
| 9 | 01001 |
| 10 | 01010 |
| 11 | 01011 |
| 12 | 01100 |
| 13 | 01101 |
| 14 | 01110 |
| 15 | 01111 |
| 16 | 001000 |
| ... | Quotient Marker Remainder |

Fig. 3

METHOD AND CIRCUIT OF HIGH PERFORMANCE VARIABLE LENGTH CODING AND DECODING FOR IMAGE COMPRESSION

BACKGROUND OF THE INVENTION

1. Field of Invention

The present invention relates to the variable length coding and decoding method, more specifically to a compression and decompression method and circuit which result in shorter code length of representing a data stream and short time in compression and decompression.

2. Description of Related Art

Efficient image compression coding plays important role in lower cost in storage and higher speed in data transmission accessing either. Another advantage of an efficient image coding is the lower power consumption in storage and data accessing due to the less data rate after compression.

There are some still image compression standard like JPEG which is a popular lossy compression algorithm with wide application like digital still camera, DSC and scanner. JPEG is a lossy compression requiring high computing power for compression and which compares to the original image data, there will some pixels become not the same values before compression which in some applications are not acceptable.

There are also other image compression algorithms like ADPCM which is also lossy algorithm with high amount of pixel values are not the same with original pixels.

This invention is to overcome the issues of high computing power of image compression as well as maintaining top quality compare to the original data with reasonable compression rate.

SUMMARY OF THE INVENTION

The present invention of high performance variable length coding for image compression reduces data rate with high throughput of compressed image and decompressing the pixel data in a short time.

The present invention of high performance image compression applies a variable length coding method to represent the differential value between adjacent pixels.

According to an embodiment of this invention, the differential value is divided by a predicted divisor, the value of Quotient and Remainder are coded by assigning number of "0s" to represent the values of the Quotient, and binary code for representing the Remainder.

According to an embodiment of this invention, the predicted divisor is represented by an integer number of the power of "2" which helps in reducing the bit number and results in high performance in encoding and decoding.

According to an embodiment of this invention, within the same clock cycle during encoding, the Quotient and Remainder of each color component of a pixel are calculated in parallel with predicted divisor.

According to an embodiment of this invention, the codes of Quotient and Remainder are separated by assigned a marker bit of "1" if the Quotient value is coded by assigning "0", and if the Quotient value is coded by assigning "1", then, the market bit is "0" as a separator.

According to an embodiment of this invention, the code of Quotient is followed by the code of Remainder and can be revised with Remainder in front followed by Quotient.

According to an embodiment of this invention, the differential values of pixel components of a pixel are separately encoded, if the input is in series, compression is done in series, if input of pixel component is in parallel, compression is done in parallel.

According to an embodiment of this invention, the value of the divisor is calculated by weighted factor of latest differential value of adjacent pixel and the previously divisor.

According to an embodiment of this invention, the three pixel components, Y, U and V of the same pixel are compressed separately and are packed together.

According to an embodiment of this invention, two levels of decoding the Quotient is applied to reduce the latency time.

It is to be understood that both the foregoing general description and the following detailed description are by examples, and are intended to provide further explanation of the invention as claimed.

BRIEF DESCRIPTION OF THE DRAWINGS

FIG. 3 illustrates a variable length which is included in this invention.

DESCRIPTION OF THE PREFERRED EMBODIMENTS

The present invention relates specifically to the image compression for data reduction while still maintaining good quality. The present invention significantly reduces the amount of data of image and stored in a storage device, and correspondingly reduces the density, bandwidth requirement, power consumption and cost of storage devices for storing streaming data.

Figure 1:
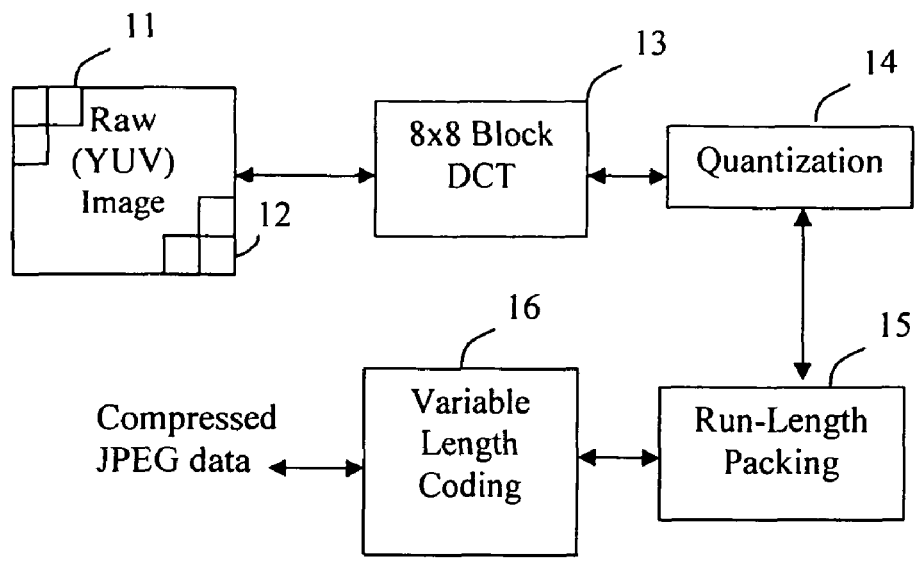
FIG. 1 shows a prior art of JPEG, a still image compression algorithm.

There are some prior arts of image compression methods of reducing image data. FIG. 1 depicts a popular compression algorithm is the still image compression standard named JPEG. JPEG compression includes some procedures in coding data stream. The color space conversion is to separate the luminance (brightness) from chrominance (color) and to take advantage of human being's vision less sensitive to chrominance than to luminance and can reduce more chrominance element without being noticed. In JPEG compression, an image is partitioned into many units of so named "Block" 11, 12 of 8×8 pixels to run the JPEG compression. A color space conversion mechanism transfers each 8×8 block pixels of the R(Red), G(Green), B(Blue) components into Y(Luminance), U(Chrominance), V(Chrominance) and further shifts them to Y, Cb and Cr. JPEG compresses 8×8 block of Y, Cb, Cr by the following compression procedures:

Step 1: Discrete Cosine Transform (DCT)
Step 2: Quantization
Step 3: Zig-Zag scanning
Step 4: Run-Length pair packing and
Step 5: Variable length coding (VLC).

DCT 13 converts the time domain pixel values into frequency domain. After transform, the DCT "Coefficients" with a total of 64 sub-bands of frequency represent the block image data, no long represent single pixel. The 8×8 DCT coefficients form the 2-dimention array with lower frequency accumulated in the left top corner, the farer away from the left top, the higher frequency will be. Further on, the closer to the left top, the more DC frequency which dominates the more information. The more right bottom coefficient represents the higher frequency which less important in dominance of the information. Like filtering, quantization 14 of the DCT coefficient is to divide the 8×8 DCT coefficients and to round to predetermined values. Most commonly used quantization table will have larger steps for right bottom DCT coefficients and smaller steps for coefficients in more left top corner. Quantization is the only step in JPEG compression causing data loss. The larger the quantization step, the higher the compression and the more distortion the image will be.

After quantization, most DCT coefficient in the right bottom direction will be rounded to "0s" and only a few in the left top corner are still left non-zero which allows another step of said "Zig-Zag" scanning and Run-Length packing 15 which starts left top DC coefficient and following the zig-zag direction of scanning higher frequency coefficients. The Run-Length pair means the number of "Runs of continuous 0s", and value of the following non-zero coefficient. The Run-Length pair is sent to the so called "Variable Length Coding" (VLC) 16 which is an entropy coding method. The entropy coding is a statistical coding which uses shorter bits to represent more frequent happen patter and longer code to represent the less frequent happened pattern. JPEG standard adopts "Huffman" coding algorithm as the entropy coding. VLC is a step of lossless compression. JPEG is a lossy compression algorithm. JPEG compression shown in FIG. 1 is a reversible procedure which means, a compressed JPEG image can be decompressed and reconstructed to be original pixel of Y, U, V forms through the reverse rout of compression by the following reverse procedure: Variable Length Decoding, VLD, Run-Length Unpacking, Dequantization, and inverse DCT.

The JPEG picture with less than 10× compression rate has acceptable good image quality, 20× compression will have more or less noticeable quality degradation. The JPEG image data stream coding costs relatively high computing power. For example, in software solution with a single CPU of 16 its data, it requires about 40 MIPS to encode a picture of 1M pixels of data within 1 second. The time distribution for encoding an JPEG image with 1M pixels is as the following: The total block number: 23,400, 1024 Macs of each block, So, DCT requires a total of 24M Macs (or 24 MIPS), quantization requires about ⅕ of that of DCT (or 5 MIPS), others dominates about another ⅕ of DCT computing time (or 5 MIPS). That comes out of ~40 MIPS.

Figure 2A:
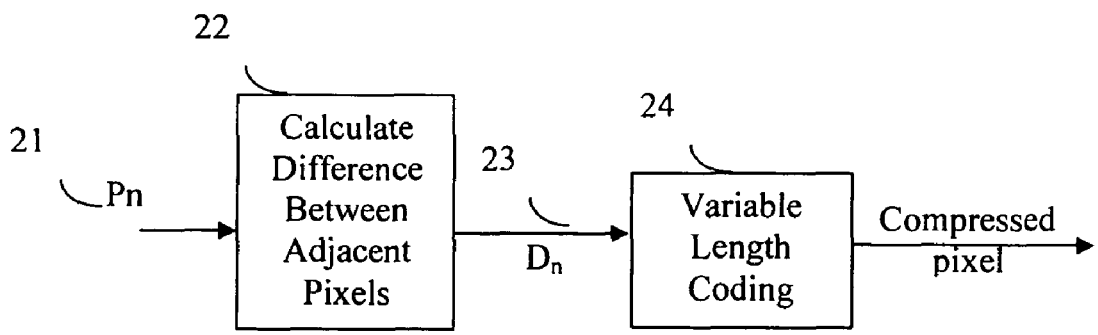
FIG. 2A depicts the process of a differential coding following by a lossless variable length encoding of the difference of adjacent pixels.
Figure 2B:
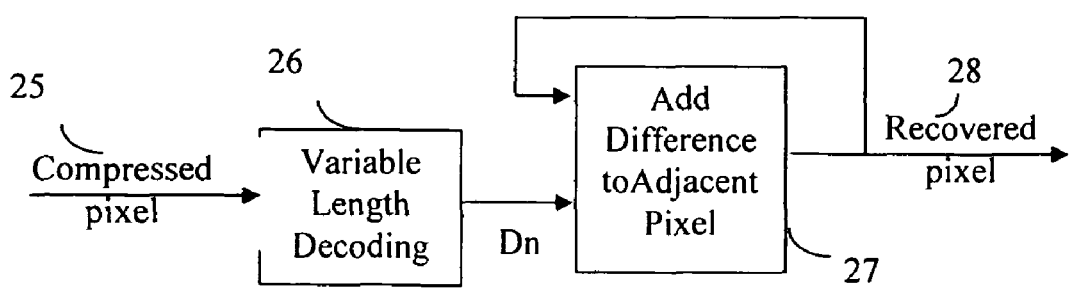
FIG. 2B depicts the process of an image decompression

This invention of efficient image compression applies a new method and circuit of the VLC coding to achieve data reduction with much less computation compared to JPEG. FIG. 2A illustrates the flowchart of basic concept of the compression comprising two procedures: firstly taking the differential value 22 of adjacent pixels 21, secondly applies a variable length coding method 24 to represent the differential value, Dn 23. The difference is then sent to a VLC coding to further reducing the data rate. Decompression procedure reverses the image compression procedure shown in FIG. 2B. The compressed pixels 25 will firstly go through variable length decoding 26 to reconstruct the differential value of adjacent pixels, and the differential value will be added 27 to the previous pixel value to recover the value of present pixel 28. The recovered pixels will be temporarily saved in a register for reference in the next pixel.

The method of new variable length coding method of image compression accords to the following equation: Diff.=Q.times.M+R (Q: Quotient, M: divisor and R: Remainder) This method of efficiently variable length coding is to code the "Quotient, Q", divisor" and "Remainder, R" with the M implicitly predicted which costs no bit in the bit stream. The VLC coding in this invention of efficient lossless data stream coding includes the following procedures:

Calculating the quotient. 26
Calculating the remainder. 26
Implicitly calculating the divisor, M or for more efficiently in calculating K, the value of $2^K$ of the divisor, M without assigning a code to represent it. For saving code, the N is predicted by examining the previous N and the Diff value, the difference of adjacent pixels. Based on the principle of high continuity of either adjacent image pixels, the divisor, M of current sample can be predicted and needs no individual code to represent it. The equation in the VLC coding of predicting the value of M is illustrated by the means of predicting the value of M.

$$M.sub.n = (M.sub.n{-}1{+}{+}D.sub.n)/2 \qquad (Eq.\ 2)$$

For example: Diff.=11=1.times.8+3, in the VLC coding of this invention, the quotient, Q=1 and Remainder, R=3 are the only two parameters needed to be coded with the M=8 (N=3) implicitly predicted by an average of weighted factors times M of previous pixels. In speeding the calculation and saving hardware in implementation, an expedition of rounding the M to be the power of 2 is adopted and M equals to the closest value between $2^{K-1}$ and $2^K$ FIG. 3 shows the table of an example of the variable length coding of the Diff. differential value 31 of adjacent pixels with a predicted divisor of 8 (K=3, 2.sup.K) Diff. of range of 0-7 has Quotient of "0" which needs no bit, since the K=3, the Remainder are all 3 bits wide. The "1" is market to separate the Quotient and Remainder. From 8-15, the Quotient value is 1 which uses bit="0" to represent it, and the Remainder are all 3 bits wide binary code. Ex. 0="1000", 1="1001", 2="1030", . . . 8="01000", 9="01001", 15="01111" . . . .

As shown in equation, M.sub.n=(M.sub.n−1+D.sub.n)/2, the D.sub.n of the closest previous sample has highest weight of ½, the next sample will have a factor of ¼, . . . etc, the farer the samples, the lower value the weighted factors and less influence to the present sample in predicting the divisor, M.

Figure 4:
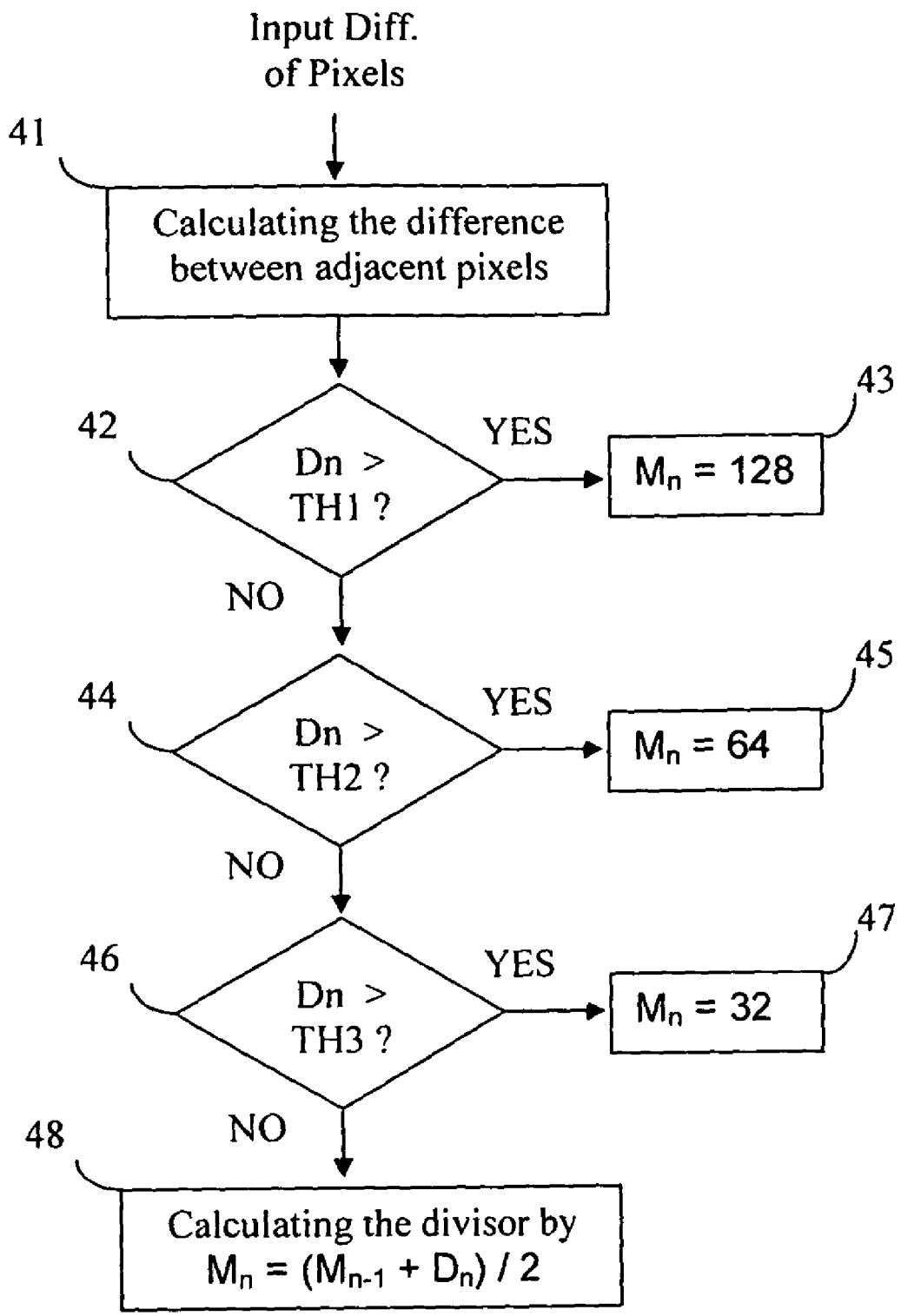
FIG. 4 illustrates the procedure of predicting the value of divisor.

In the edge of a new pattern or object in a picture, the differential value, Dn changes sharply and the equation, M.sub.n=(M.sub.n−1+D.sub.n)/2 can not update the divisor M or K which causes higher bit rate in coding the Quotient and Remainder. As shown in FIG. 4, for reducing the bit rate of pixel in the edge of new pattern or new object, when the D.sub.n value 41 is larger than a threshold 42, for example, TH1, the divisor is set to a predetermined value 43 like "128", when the D.sub.n value is larger than a threshold 44, for example, TH2, the divisor is set to a predetermined value 45 like "64", when the D.sub.n value is larger than a threshold 46, for example, TH3, the divisor is set to a predetermined value 47 like "32", others value of D.sub.n, will the divisor uses prediction equation 48: $M_n=(M_{n-1}+D_n)/2$. If the current divisor does not adopt this prediction equation, then, no matter the differential value of the next Dn (or said D.sub.n+1), the previous divisor, M.sub.n−1 is assigned to be the next divisor ($M_{n-1}=M_{n+1}$) instead of the one of the three predetermined values, for example, the "128", "64", "32".

Figure 5:
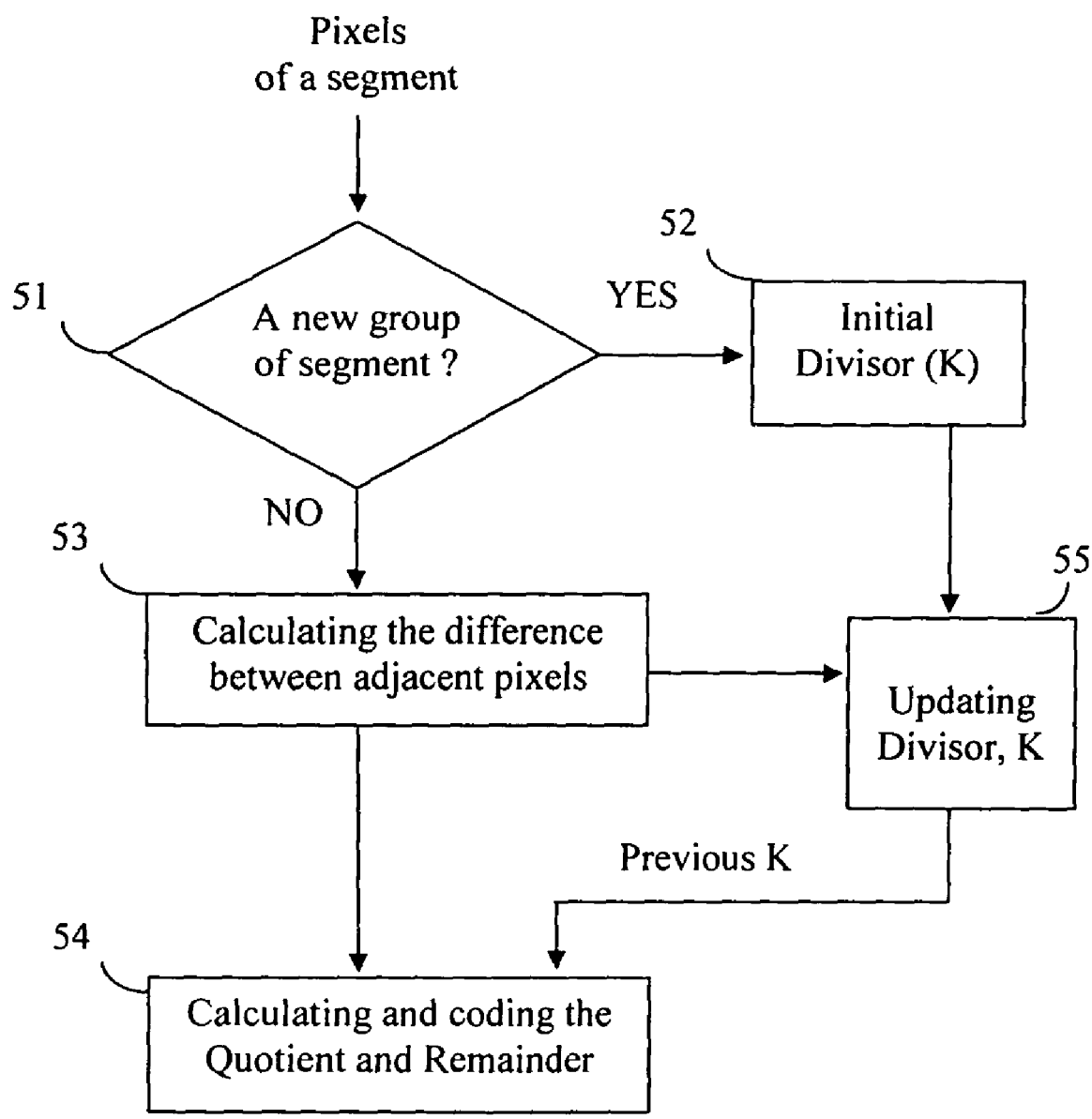
FIG. 5 depicts procedure of the VLC coding for the Diff. of adjacent pixels of a group of pixels.

For efficiency and cost consideration, in implementing this invention, an image is partitioned to be thousands, hundreds of thousands or even millions of "Segments" with each segment having pixel number ranging from 8 to 1024 pixels with the default of 32 or 64 pixels. FIG. 5 shows the flowchart of segment by segment image compression. The differential value of adjacent pixels or the adjusted differential value which might be for example, converted from negative to positive is accumulated to for a segment, each new segment of pixels 51 will be assigned an initial divisor, the K 52. The difference, Dn, between the input pixel component, ex. Y or U/Cb or V/Cr and previous pixel will be calculated 53. The Dn will be input to update the divisor 55, K for coding the next pixel. The D.sub.n will also be divided by $2^K$, the divider divisor, and the "Quotient" and the "Remainder" 54 can therefore be calculated.

For instance, if the previous K=3, a pixel component of Y equals to 46 and previous Y equals to 13, the Dn will become 23 (46−13=23) (binary code=10111) which is divided by 8 (K=3) results in Quotient of "2" (binary code="10") and Remainder of "7" (binary code=111). In realization of the coding, the Remainder is an easy work by just assigning the LSB 3 bits of the Dn to be the Remainder, while the Quotient of the MSB 2 bits needed to be converted from "binary code=" 10" to be "2" which in coding will be two "0s". With a marker bit of "1" separating the Quotient and Remainder, the resulted code of "001111" of the first two bits of Quotient and the last 3 bits Remainder.

Figure 6:
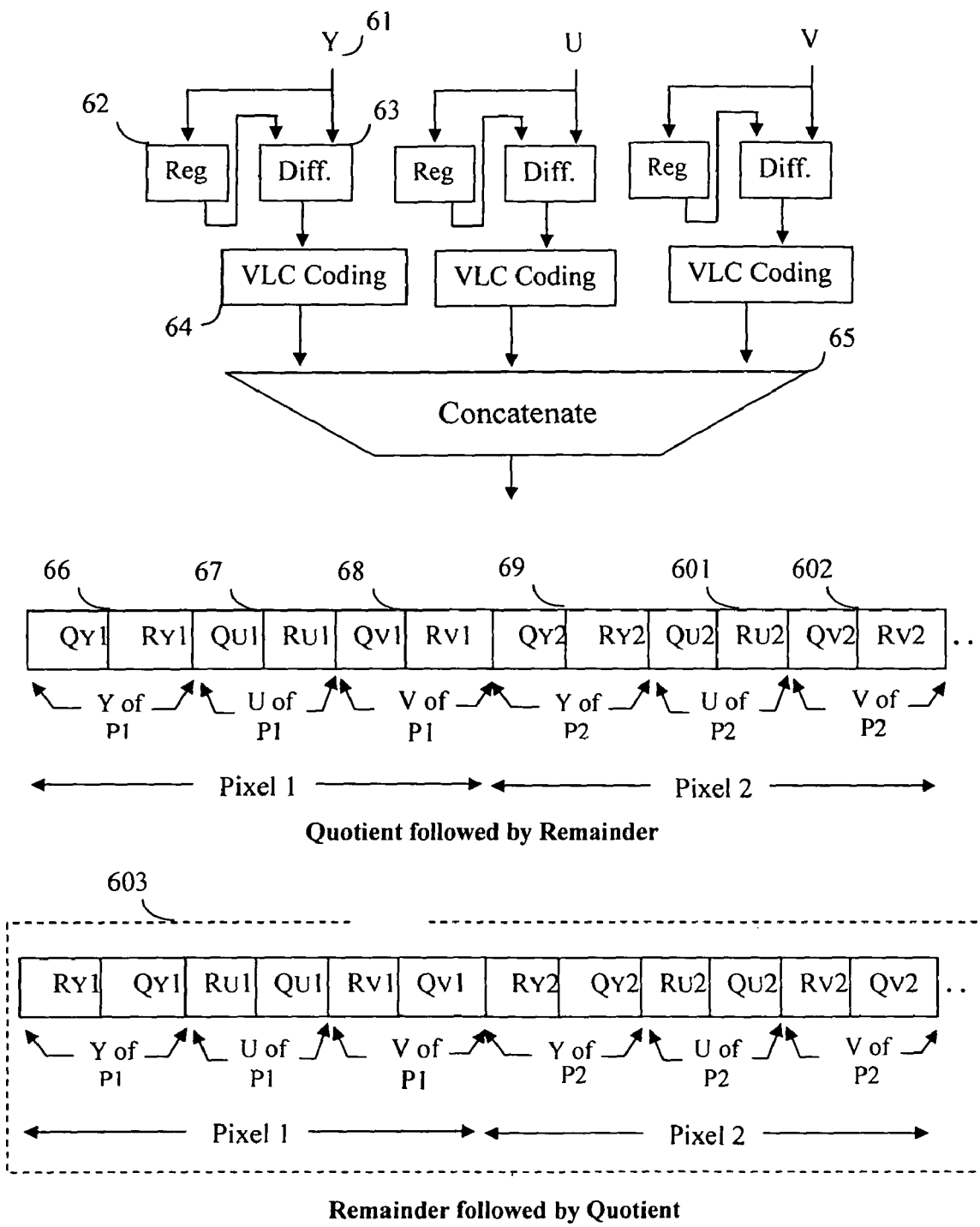
FIG. 6 illustrates the process of coding the image pixel with three pixel components (YUV/pixel) and the structure of the compressed pixel data.

FIG. 6 shows the implementation of encoding the pixel with three components. The difference between input pixel components, Y 61, U/Cb and V/Cr and their corresponding previous pixel which are temporarily saved in the registers 62 are calculated 63 and are coded by the variable length coding method 64. The encoded pixel components of Y, U and V will then be concatenated 65 pixel by pixel. The encoded pixel component of Quotient and Remainder of each component 66, 67, 68 will be put together and followed by the next pixel components 601, 602. The order of putting Quotient in front of Remain or Remainder in front of Quotient 603 makes a little difference in decoder with the later having a little faster since the Remainders are known since the K, divisor are know before decoding procedure of each pixel begins and decoding the Remainder can be done in parallel with the decoding the Quotient.

In some applications, the input component of a pixel for each clock cycle might have one Y, the Luma and one C, Chroma (U or V) with one U in the first cycle, and V in another cycle. In this case, the difference and the VLC hardware can be shared and the encoded data stream will have one Y followed by one C in a cycle and another Y with another C in the next clock cycle. The performance of compressing an image is depending on the algorithm as well as the hardware cost. The more hardware in parallel, the higher throughput can be generated.

Figure 7:
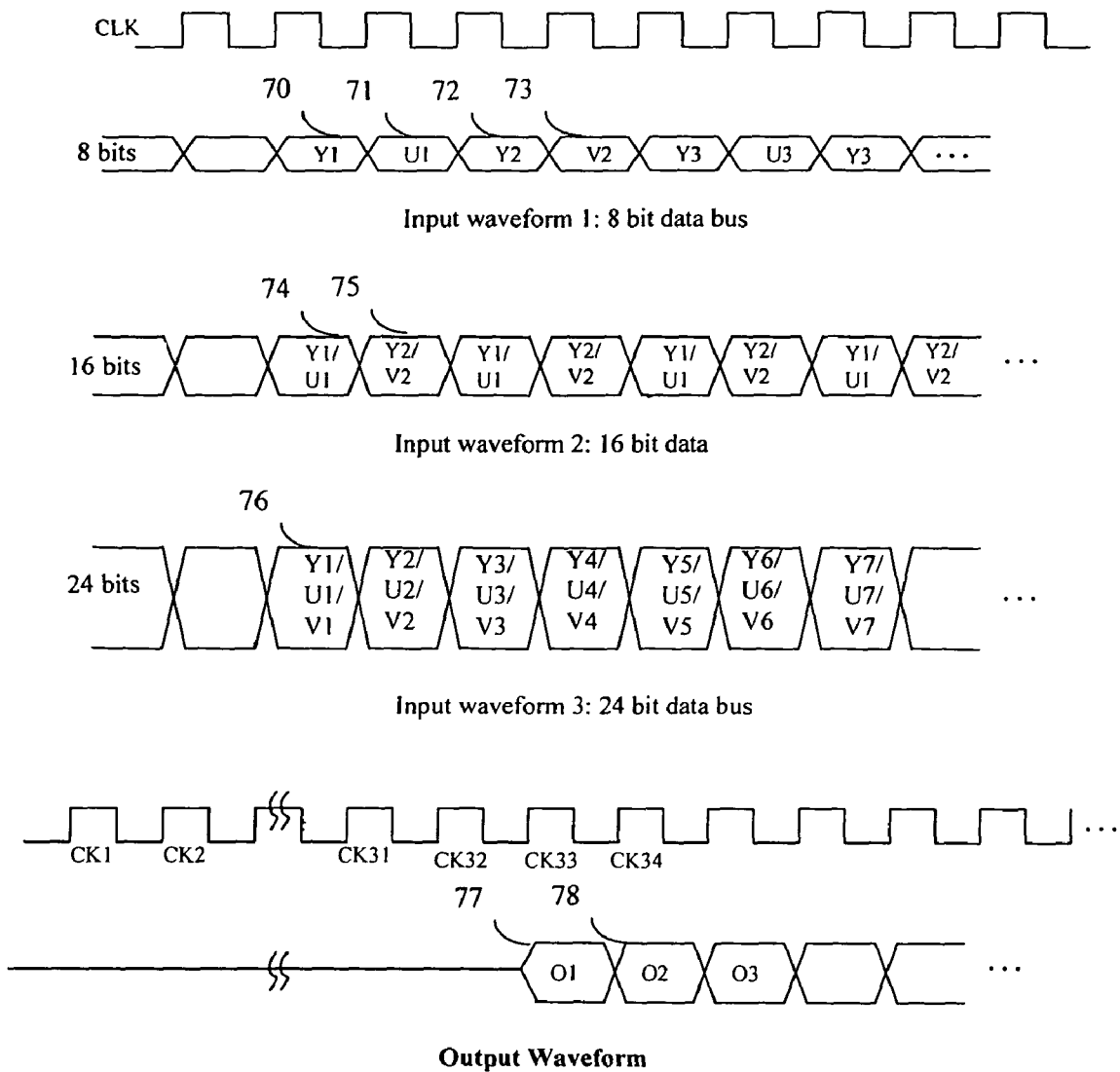
FIG. 7 illustrates the input waveforms of pixel data to be compressed and the output of the compressed pixels.

FIG. 7 shows three kinds of input waveforms, the first one is an 8-bit input pixel bus with each clock having one of the Y, U and V component 70, 71, 72, 73 with Y interlacing between the U and V. The $2^{nd}$ waveform has 16 bits of pixel component with each clock cycle having one Y and one U 74 or one V 75.

Both the first and second input waveforms are so call 4:2:2 format which means each Y has a U or a V interlaced. In a 4:4:4 format which has higher number of color component might input 3 pixel components 76 in the same clock cycle with a 24-bit pixel data input at the same clock cycle. Depending on the pixel number of each segment, the first output of the compressed pixels will have delay time of for instance 32 clock cycles with the rest of pixels with pipelining output.

Figure 8:
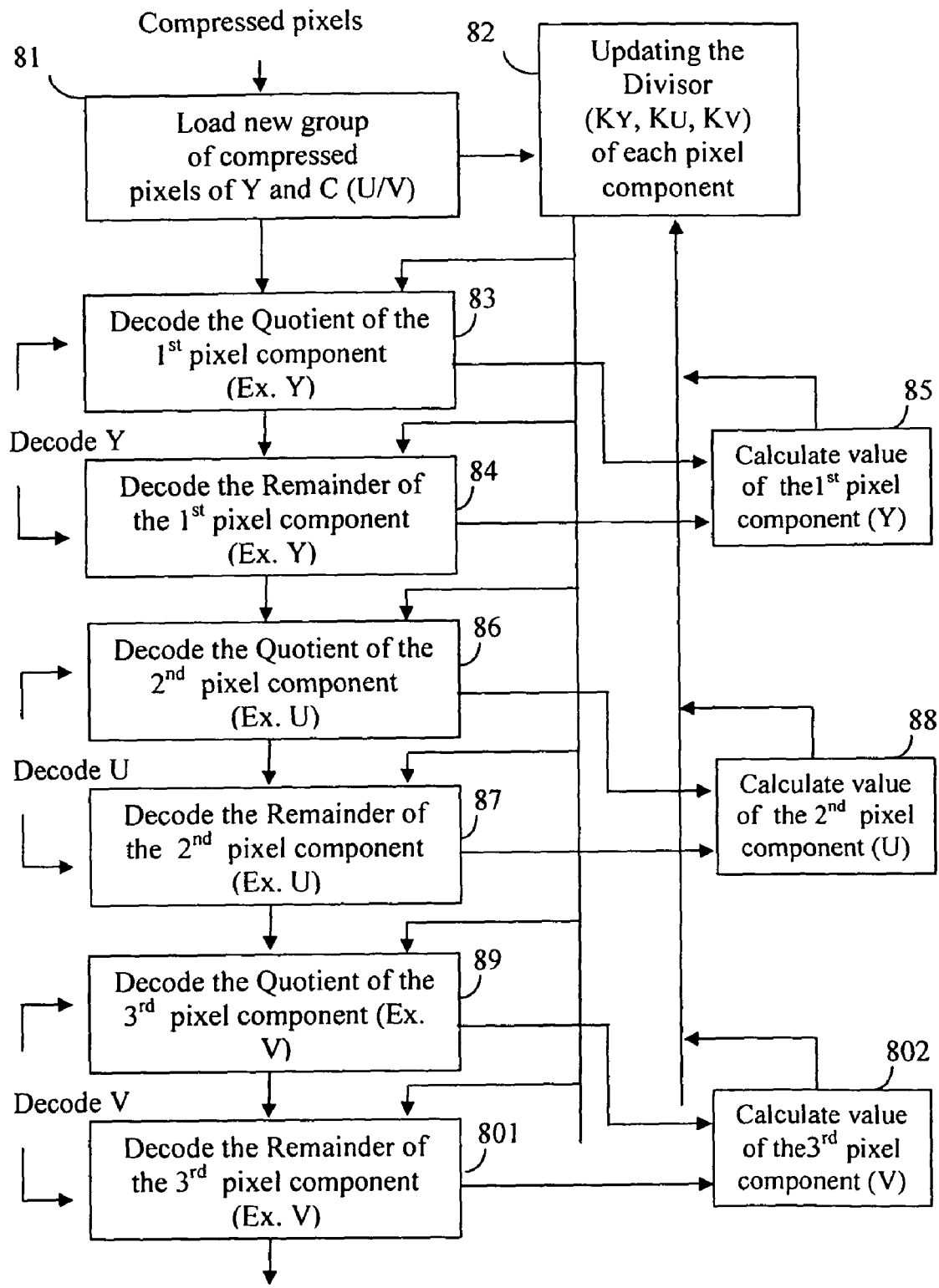
FIG. 8 depicts the flowchart of high performance lossless data decoding of the compressed pixel by decoding the Quotient and Remainder with calculation of divisor.

In reconstructing the compressed pixels, in gaining high throughput and reconstructing three (or two in 4:2:2 format) pixel components, Y, U, V in a clock cycle. This invention decodes three pixel components in one clock cycle with an example decoding procedure as shown in FIG. 8 with Quotient in front of Remainder in pixel stream. A group of compressed pixels are loaded 81 to the decompression temporary buffer with mixed compressed code of Quotients and Remainder of pixel components, Y, U and V together in the data stream. The first step is to decode the Quotient of the 1.sup.st pixel component 83, for example, the Y. Then, the Remainder can be extracted and decoded. Since the remainder is coded by binary code which number of bit is the value of K, the power of the divisor. The decoded value of Quotient and Remainder plus the divisor can recover the differential value 85 of the adjacent pixel and the differential value is used to calculate the next divisor, the K 82. After the Quotient and Remainder of the ist pixel component is decoded, the next step is to decode the 2.sup.nd pixel component by calculating the Quotient 86 and Remainder 87 which procedure is the same like that in decompressing the 1.sup.st pixel component. The calculated value of the 2.sup.nd pixel component is applied to determine the next divisor, K value. For some application with 3.sup.rd pixel component in the same clock cycle, the same decompressing procedure like the 1.sup.st and 2.sup.nd pixel components is applied to decode the Quotient 89 and Remainder 801. And the calculated value of the 3.sup.rd pixel component is used to decide the next divisor 801, K value. Those divisors of all three (or two) pixel components are updated 82 each clock cycle after each differential value is calculated.

Since the divisors of a pixel are known before decoding procedure begins, the Remainders of a pixel, are known as well. Should Remainder is placed in front of Quotient, decoding the Remainder can be done in parallel with decoding the Quotient which gains a little speed by reducing the additional delay time of decoding the Remainders of a pixel components. FIG. 8 is just an example of decoding the compressed pixel with the Quotient in front of Remainder, actually, the procedure of decoding the Quotient 83 and Remainder 84 (and 86, 87 in decoding U and 89, 801 in decoding V) can be swapped and gains more speed.

For achieving higher performance with shorter delay time in decoding the differential values of pixel component, the bottleneck is the decoding of the quotient f each pixel component. In the worst case, the Quotient might be as long as 16 bits or even longer, should it is decoded by one look up table mapping it cost long cascaded delay time. The one look up table is shown like the following:

| | |
|---|---|
| Code = " 1xxx" | Q_Value = "0" |
| Code = " 01xxx" | Q_Value = "1" |
| Code = " 001xxx" | Q_Value = "2" |
| ... | ... |
| Code = "0000000000001xxx" | Q_Value = "12" |
| Code = "00000000000001xxx" | Q_Value = "13" |
| Code = "000000000000001xxx" | Q_Value = "14" |

-continued

| | |
|---|---|
| Code = "0000000000000001xxx" | Q_Value = "15" |
| Code = "00000000000000001xxx" | Q_Value = "16" |

The longest delay time of decoding the Quotient by above table will be a gate with series input of 16 bits of number. In this invention, one of the key of speeding up is to break the above one large table into four smaller table with 2 levels of decoding. The following is a brief conceptual description of the new 2 levels of decoding the Quotient value:

| | | | |
|---|---|---|---|
| Code = "0000" | | | then, T4 = "1" |
| Code = "000" | | | then, T3 = "1" |
| Code = "00" | | | then, T2 = "1" |
| Code = "0" | | | then, T1 = "1" |
| If | | | |
| Code = "0000" | and | T4 = "1", | then T8 = "1" |
| Code = "000" | and | T4 = "1", | then T7 = "1" |
| Code = "00" | and | T4 = "1", | then T6 = "1" |
| Code = "0" | and | T4 = "1", | then T5 = "1" |
| If | | | |
| Code = "0000" | and | T8 = "1", | then T12 = "1" |
| Code = "000" | and | T8 = "1", | then T11 = "1" |
| Code = "00" | and | T8 = "1", | then T10 = "1" |
| Code = "0" | and | T8 = "1", | then T9 = "1" |
| If | | | |
| Code = "0000" | and | T12 = "1", | then T16 = "1" |
| Code = "000" | and | T12 = "1", | then T15 = "1" |
| Code = "00" | and | T12 = "1", | then T14 = "1" |
| Code = "0" | and | T12 = "1", | then T13 = "1" |

Figure 9:
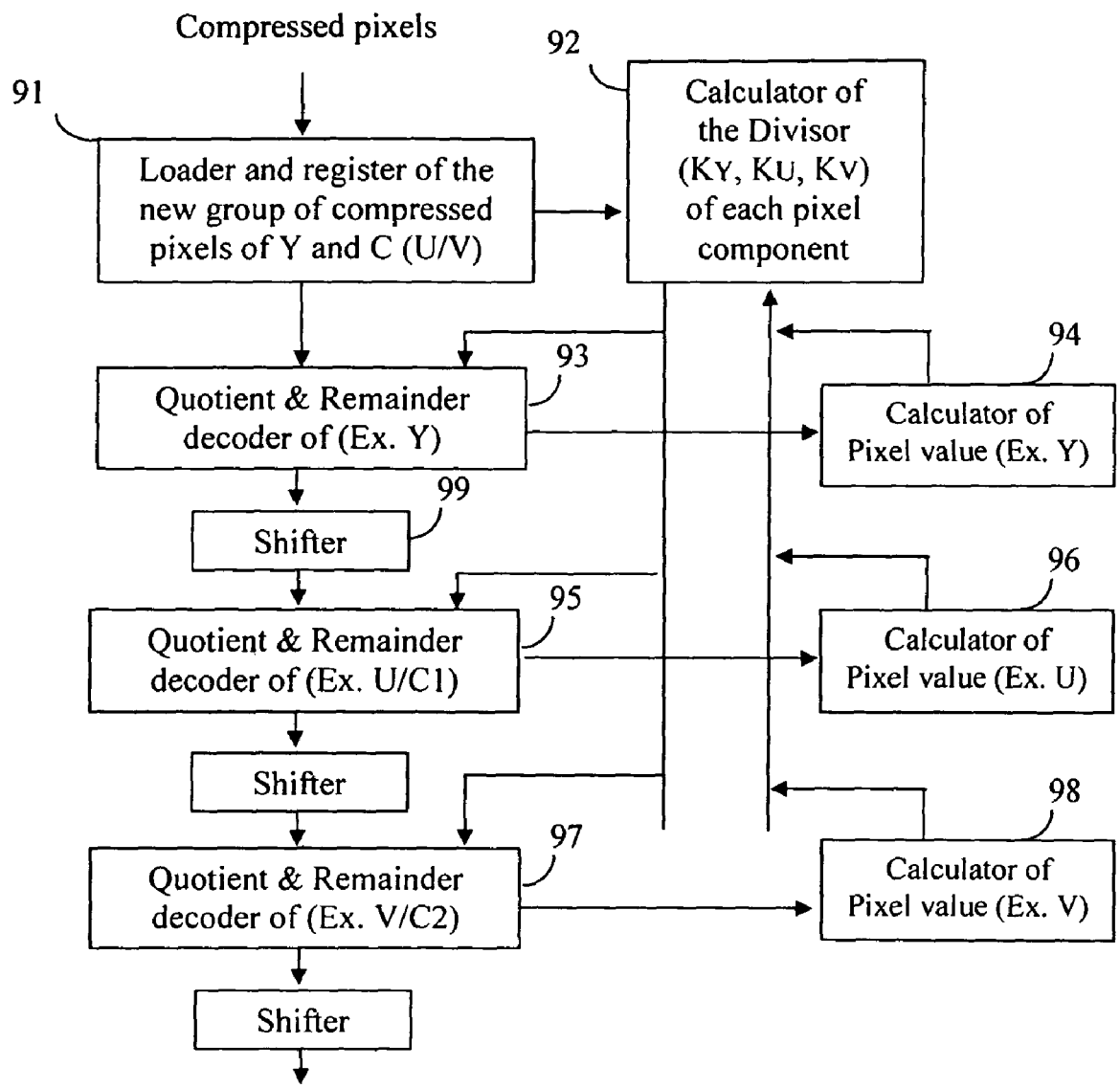
FIG. 9 depicts the block diagram of implantation of the high performance lossless data decoding of the compressed pixel by decoding the Quotient and Remainder with calculation of divider of each pixel component.

In realizing this high efficiency variable length codec of the image compression, a group of compressed pixels 91 fills the register with a predetermined depth with the control of loader as shown in FIG. 9. The $1^{st}$ decoder 93 for the $1^{st}$ pixel component, said Y, calculates the Quotient and Remainder and the results are sent to the calculator to reconstruct the pixel component value 94. Once the Quotient and Remain are determined, a shifter 99 aligns the rest of code to go through the $2^{nd}$ decoder 95 of decoding the Quotient and Remainder of the $2^{nd}$ pixel component with similar mechanism as the $1^{st}$ decoder. The reconstructed Quotient and Remainder are used to calculate the next divisor 96 of the $2^{nd}$ pixel component. Same to the circuit of decoding the $1^{st}$ pixel component, after decoding the $2^{nd}$ pixel component, the compressed code is shifted and is fed to the $3^{rd}$ decoder 97 for reconstruct the Quotient and Remainder, and afterward, the Quotient and Remainder are used to update the divisor 98 for next pixel.

A pixel comprising Red, Green and Blue (R, G, B) color component is applicable to this invention. Replacing Y, U, V pixel component by R, G, B can simply apply the R, G, B component into this invention of the high performance image compression.

It will be apparent to those skills in the art that various modifications and variations can be made to the structure of the present invention without departing from the scope or the spirit of the invention. In the view of the foregoing, it is intended that the present invention cover modifications and variations of this invention provided they fall within the scope of the following claims and their equivalents.

What is claimed is:

1. A method of compressing pixel components, comprising:
    calculating differential values between adjacent pixels of a group of pixels within an image frame;
    calculating and coding the value of quotient obtained from dividing one differential value by a predicted divisor;
    calculating and coding, using a circuit, the value of remainder obtained from dividing said one differential value by the predicted divisor being represented by an integer number with the power of 2;
    calculating next value of the predicted divisor by reference to current value of the predicted divisor wherein the value of the predicted divisor is adjusted dynamically during compression; and
    using the next value of the predicted divisor to calculate and code the values of quotient and remainder for another differential value next said one differential value.

2. The method of claim 1, wherein at least one value of the divisor is the average of the last value of the predicted divisor and a previous differential value of adjacent pixels.

3. The method of claim 1, wherein the code of the quotient and a marker bit used to separate the code for the quotient and the code for the remainder use different polarity of a digital bit.

4. The method of claim 1, wherein a first predetermined value is assigned to be the predicted divisor of a pixel if the differential value of adjacent pixel is greater than a first threshold, a second predetermined value is assigned to be the predicted divisor of a pixel if the differential value of adjacent pixel is greater than a second threshold, and a third predetermined value is assigned to be the predicted divisor of a pixel if the differential value of adjacent pixel is greater than a third threshold.

5. The method of claim 4, wherein the quotient of a pixel component can be coded first, followed by the remainder of the same pixel component, or the remainder can be coded first, followed by the quotient.

6. The method of claim 1, wherein when the differential value between the next pixel and the previous pixel is larger than a predetermined threshold, the previous predicted divisor is used as the predicted divisor for coding the next pixel.

7. The method of claim 1, wherein the remainder is a binary code having the same bit number of the divisor which is an integer number of the power of 2.

8. A method of efficiently decompressing pixel components, comprising:
    fetching compressed pixel components which are stored in an image buffer;
    applying a variable length decoding procedure including but not limited to the following steps:
    calculating a remainder, using a circuit, of a first pixel component by referring to the current divisor and the calculated first quotient;
    calculating a quotient of the first pixel component by referring to the current divisor and remainder; and
    applying a decoded remainder and quotient to calculate a differential value of the adjacent pixel component and to determine a divisor value for the next pixel component;
    re-aligning the compressed pixel component bit position and repeat the above variable length decoding procedure for recovering the second pixel component; and
    if there is a third pixel component within the compressed pixels, then, realigning the compressed pixel component bit position and repeating a variable length decoding procedure for recovering the third pixel component.

9. The method of claim 8, wherein the value of the predicted divisor of the power of 2 is assigned to represent the number of bits of the remainder.

10. The method of claim 8, wherein the remainder and the quotient of the first pixel component are decoded in parallel, followed by the remainder and the quotient of the second pixel component which are also decoded in parallel and if available, followed by the remainder and quotient of the third pixel component which are decoded in parallel.

11. The method of claim 8, wherein the quotient of the first pixel component is decoded first followed by the remainder of the first pixel component, then, the quotient of the second pixel component is decoded and followed by the remainder of the second pixel component, and if the third component is available, the quotient of the first pixel component is decoded, then followed by the remainder of the third pixel component.

12. The method of claim 8, wherein the decoded quotient and the previous divisor are used to calculate the divisor of the next pixel.

13. The method of claim 8, wherein decoding the quotient and the remainder of a pixel components and updating the divisors of the next pixel components are completed in a fixed clock cycle time.

14. The method of claim 8, wherein at least two levels of decoding procedure is applied to decode the quotient value of each pixel component.

15. An apparatus for efficiently decompressing differential value of adjacent pixels, comprising:
- a loader accessing and storing compressed pixel data into a temporary storage device and fetching the compressed data for decoding;
- at least a circuit decompressing a first pixel component comprising the following circuits:
- a first VLD decoder decoding a quotient and another VLD decoder decoding a remainder of the differential value of the first pixel component with these two decoders decoding the quotient and remainder in parallel based on a current divisor;
- a calculator with input of a decoded quotient and a remainder from the first VLD decoder, calculating the value of the differential value of the first pixel component, and then calculating a divisor of the next pixel; and
- a shifter shifting out a decoded quotient, marker and remainder bits and feeding shifted bits into the next circuit for decoding the next pixel component;
- a second decoding circuit with the input from the shifted bits of the compressed pixel component, if the second pixel component is available in the same clock cycle with the first pixel component, going through the same decoding procedure as for the first pixel component; and
- a third decoding circuit with the input from the shifted bits of the compressed pixel component, if the third pixel component is available in the same clock cycle with the first pixel component, going through the same decoding procedure as for the first pixel component.

16. The apparatus of claim 15, wherein the remainder and quotient are decoded in parallel, and the decoded remainder and quotient are used to decode the differential value of the adjacent pixels which is used to calculate the predicted divisor for the next pixel.

17. The apparatus of claim 15, wherein the decoded first pixel component is used as a reference to decode the second pixel component, and the decoded second pixel component is used as a reference to decode the third pixel component.

18. The apparatus of claim 15, wherein a quotient decoder with two levels of logic gates of decoding is applied to calculate the quotient of the differential value.

* * * * *